United States Patent
Yang

(10) Patent No.: US 8,356,718 B2
(45) Date of Patent: Jan. 22, 2013

(54) SERVER RACK ASSEMBLY

(75) Inventor: Chieh Yang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 598 days.

(21) Appl. No.: 12/558,832

(22) Filed: Sep. 14, 2009

(65) Prior Publication Data

US 2010/0314337 A1 Dec. 16, 2010

(30) Foreign Application Priority Data

Jun. 12, 2009 (CN) .......................... 2009 1 0303198

(51) Int. Cl.
*A47F 7/00* (2006.01)
(52) U.S. Cl. ........................................................ 211/26
(58) Field of Classification Search .................. 211/26, 211/183, 26.2; 312/334.4, 223.1; 361/727, 361/679.27
See application file for complete search history.

(56) References Cited

U.S. PATENT DOCUMENTS

| | | | |
|---|---|---|---|
| 6,681,942 B2 * | 1/2004 | Haney | 211/183 |
| 6,974,037 B2 * | 12/2005 | Haney | 211/26 |
| 7,134,558 B1 * | 11/2006 | Mimlitch et al. | 211/26 |
| 7,255,409 B2 * | 8/2007 | Hu et al. | 312/334.4 |
| 7,258,568 B2 * | 8/2007 | Shih | 439/377 |
| 7,281,633 B2 * | 10/2007 | Hartman et al. | 211/26 |
| 7,281,694 B2 * | 10/2007 | Allen et al. | 248/244 |
| 7,405,926 B2 * | 7/2008 | Wu et al. | 361/679.27 |
| 7,506,768 B2 * | 3/2009 | Rassmussen et al. | 211/26 |
| 7,536,752 B2 * | 5/2009 | Laursen | 16/358 |
| 7,703,734 B2 * | 4/2010 | Chen et al. | 248/298.1 |
| 7,755,904 B2 * | 7/2010 | Wu et al. | 361/727 |
| 7,780,253 B1 * | 8/2010 | Lu | 312/334.4 |
| 7,866,488 B2 * | 1/2011 | Mimlitch et al. | 211/26 |
| 7,929,279 B2 * | 4/2011 | Liu | 361/679.02 |
| 7,934,607 B2 * | 5/2011 | Henderson et al. | 211/26 |
| 7,950,753 B2 * | 5/2011 | Liang | 312/334.4 |
| 8,079,654 B2 * | 12/2011 | Yu et al. | 312/334.4 |
| 8,083,298 B2 * | 12/2011 | Henderson et al. | 312/223.1 |

* cited by examiner

*Primary Examiner* — Jonathan Liu
*Assistant Examiner* — Stanton L Krycinski
(74) *Attorney, Agent, or Firm* — Altis Law Group, Inc.

(57) ABSTRACT

A server rack assembly includes a base with a pair of opposite stands, a rack spanning between the stands, and a pair of mounting apparatuses respectively mounted on two ends of the rack. Each stand defines one first positioning hole therein. Each mounting apparatus includes a fixing member comprising a hook thereon for engaging with the corresponding first positioning hole of one of the stands, and a locking member comprising of a restriction portion slidably positioned on the fixing member and moveable between a first position and a second position. In the first position, the restriction portion is received in the corresponding first positioning hole. In the second position, the restriction portion is out of the corresponding first positioning hole.

14 Claims, 4 Drawing Sheets

SERVER RACK ASSEMBLY

BACKGROUND

1. Technical Field

The present disclosure relates to a server rack assembly for mounting a rail to different server rack bases.

2. Description of Related Art

Server system racks have been provided for housing electronic equipment, such as network server systems, data storage devices, power supplies, and the like. A server rack assembly generally includes a base and a pair of rail structures for attaching a receiving bracket to the base. Conventionally, a rail structure includes an internal rail mounted on the receiving bracket, and an external rail mounted on the base. The internal rail is slidably received in the external rail for mounting the receiving bracket on the base. The external rail is usually mounted on the base by screwing or bolting. However, this method is of a fixed structure where each external rail is only suitable for mounting on one particular kind of base. In actual use, base designs vary, and so costs are higher because mating rails must be designed and manufactured for accommodating different bases.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
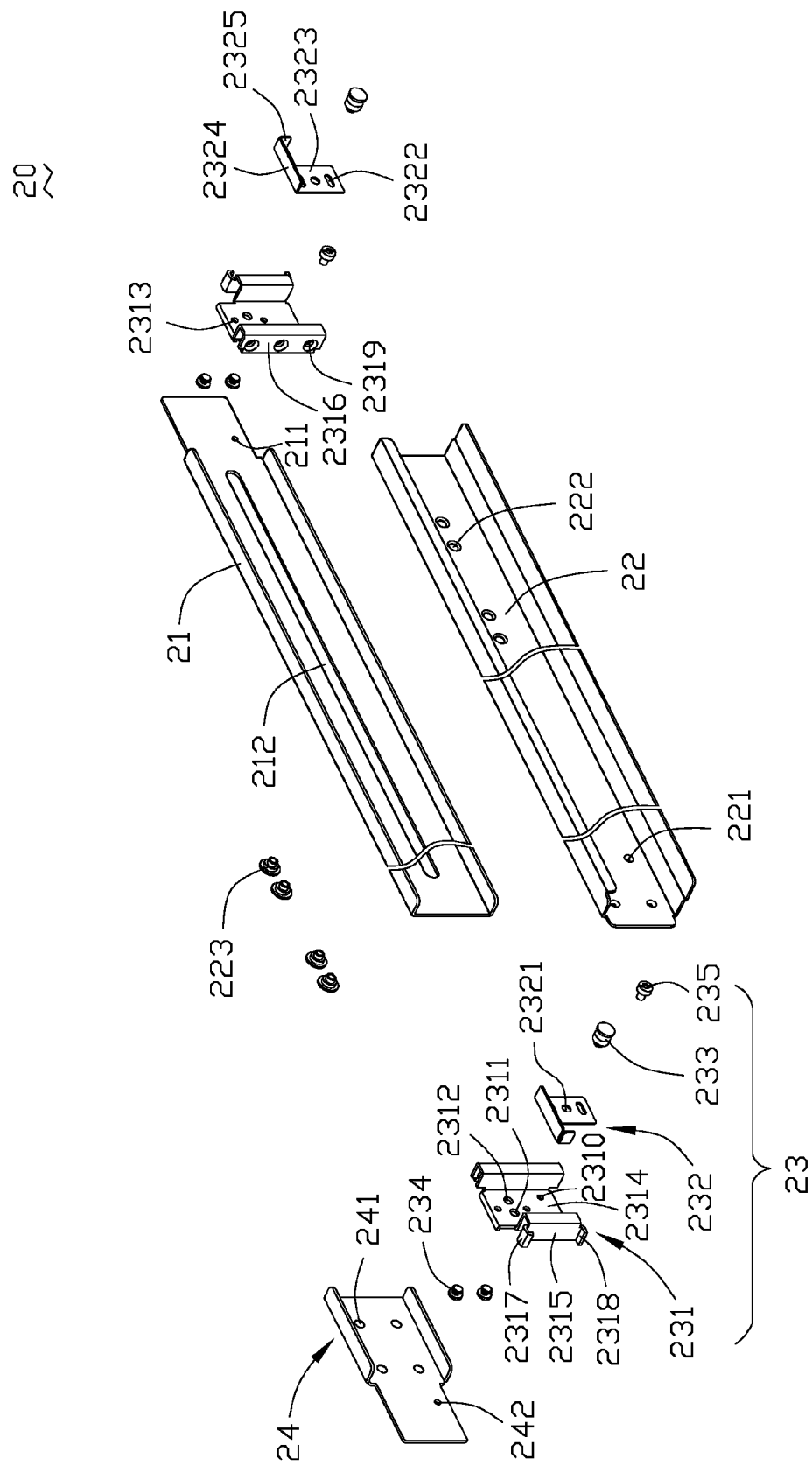
FIG. 1 is an exploded, isometric view of an embodiment of a server rack assembly.
Figure 2:
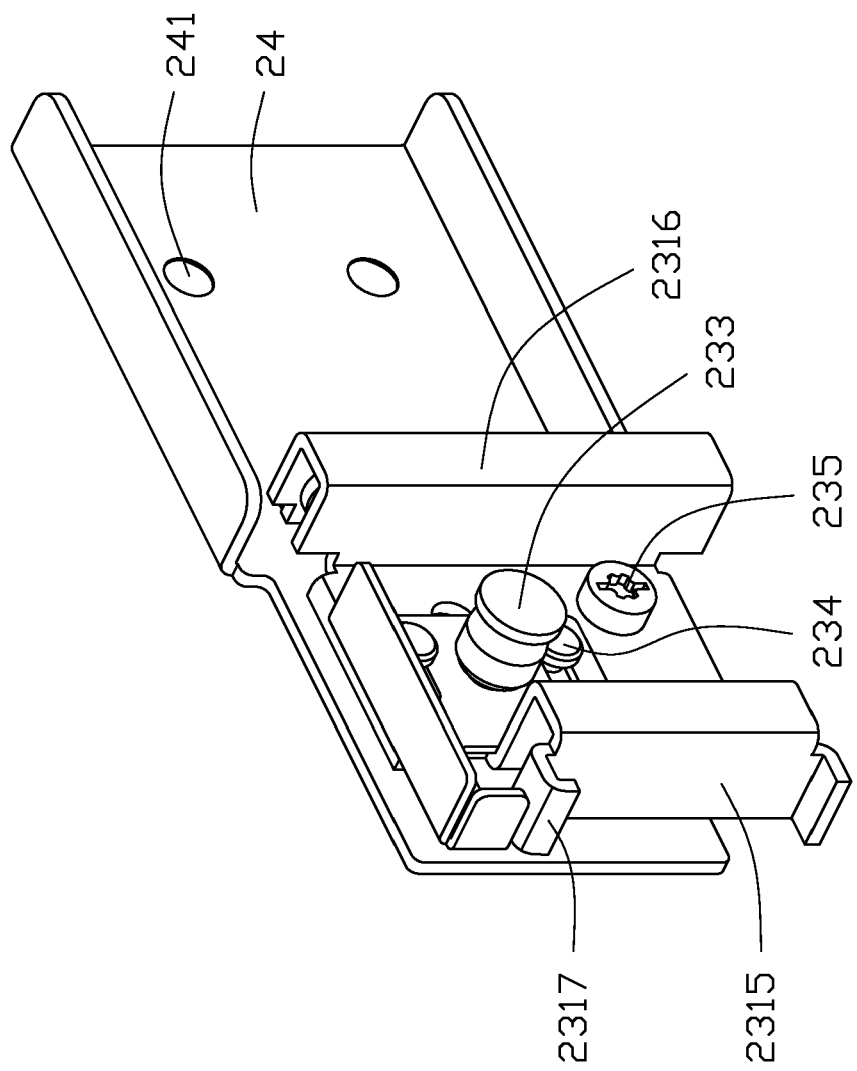
FIG. 2 is an assembled view of the securing bracket and the mounting apparatus mounted on the internal rail of FIG. 1.
Figure 3:
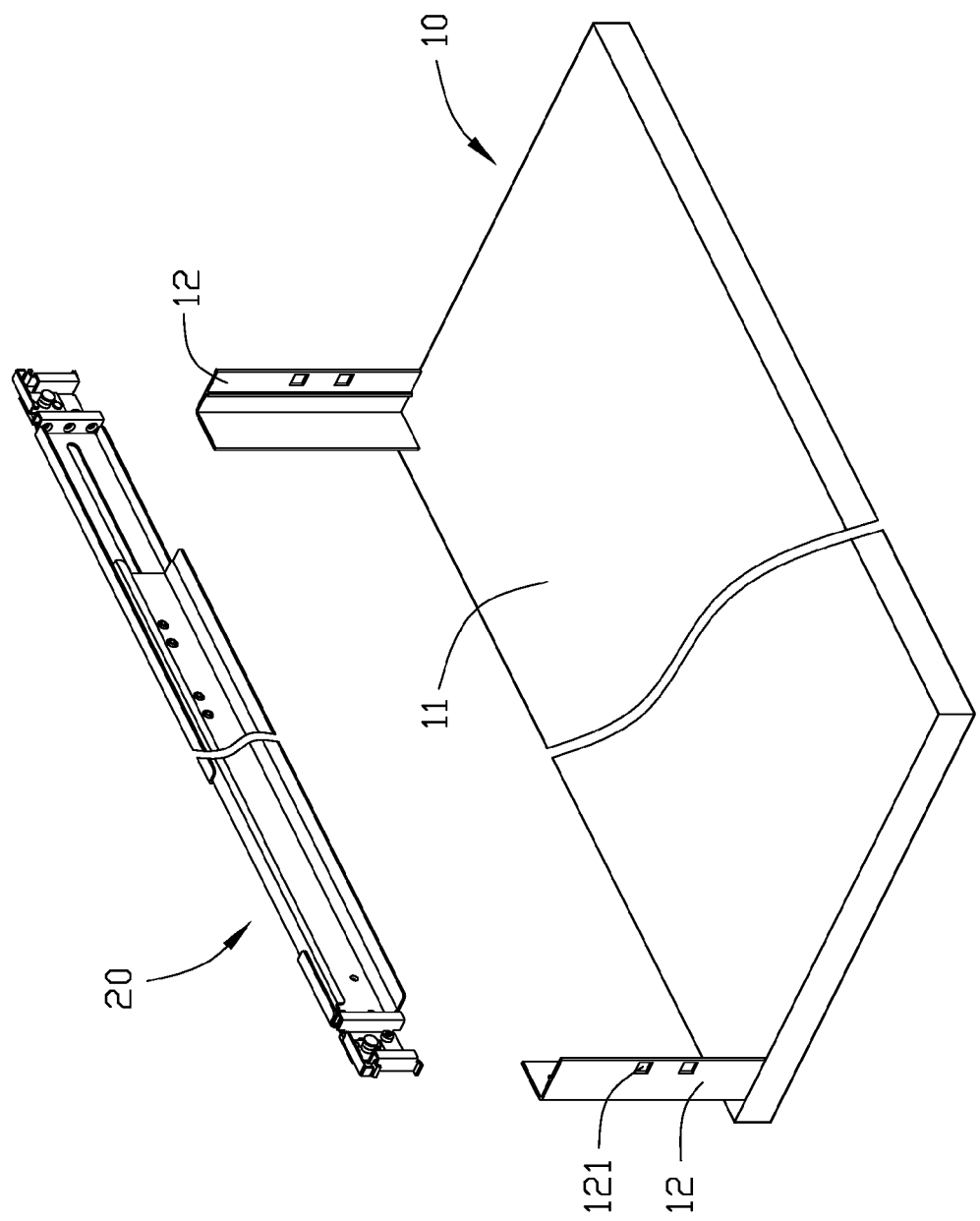
FIG. 3 is an assembled view of the server rack assembly of FIG. 1, together with a base.

Referring to FIGS. 1 to 3, an embodiment of a server rack assembly for fixing a rack 20 on a base 10 includes an external rail 21, an internal rail 22, a securing bracket 24 mounted on the internal rail 22, and a pair of mounting apparatuses 23 respectively mounted on one end of the external rail 21 and internal rail 22. The base 10 includes a rectangular plate 11. Two stands 12 perpendicularly extend up from two adjacent corners of the plate 11 and are used to support the external rail 21 and the internal rail 22. Each stand 12 defines a pair of positioning holes 121. The external rail 21 defines a long sliding slot 212 therein. The internal rail 22 defines four securing holes 222 therein corresponding to the sliding slot 212. Four fasteners 223 extend through the sliding slot 212 and are correspondingly located in the securing holes 222 for slidably attaching the internal rail 22 on the external rail 21.

Each mounting apparatus 23 includes a fixing member 231, a locking member 232 capable of being secured on the fixing member 231, and an adjusting member 233 capable of extending through the fixing member 231 and locking member 232. The fixing member 231 includes a connecting portion 2314. Two bent portions 2315 and 2316 extend perpendicularly from two opposite sides of the connecting portion 2314. A hook 2317 is bent from a top edge of the bent portion 2315. An arm 2318 is bent horizontally from a bottom edge of the bent portion 2315. The bent portion 2316 defines a plurality of screw holes 2319 therein for securing a server (not shown). The connecting portion 2314 defines a first accommodating hole 2311 and a second accommodating hole 2312 therein corresponding to the adjusting member 233. The connecting portion 2314 defines two mounting holes 2313 above and below the first and second accommodating holes 2311, 2312 respectively. The connecting portion 2314 defines a locating hole 2310 therein adjacent to the bent portion 2316.

The locking member 232 includes an upright junction portion 2323. A top wall 2324 is bent horizontally from a top edge of the junction portion 2323. The junction portion 2323 defines a through hole 2321 therein corresponding to the adjusting member 233. The junction portion 2323 defines two sliding slots 2322 above and below the through hole 2321 respectively. A restriction portion 2325 is bent downwards from an edge on one side of the top wall 2324. Two fasteners 234 extend through the corresponding sliding slots 2322 and mounting holes 2313 to secure the locking member 232 on the fixing member 231. The adjusting member 233 extends through the through hole 2321 and is slidably received in the first and second accommodating holes 2311, 2312.

The external rail 21 defines a fixing hole 211 in the one end corresponding to the locating hole 2310 of the fixing member 231. The fastener 235 extends through the locating hole 2310 and fixing hole 211 to fix the fixing member 231 on the external rail 21. The securing bracket 24 defines four securing holes 241 therein, and a fixing hole 242 on one side of the securing holes 241 corresponding to the locating hole 2310 of the fixing member 231. The internal rail 22 has four fixing tabs 221 on the one end corresponding to the securing holes 241 of the securing bracket 24. The fixing tabs 221 extend through the corresponding securing holes 241 to fix the securing bracket 24 on the internal rail 22. Simultaneously, the fastener 235 extends through the locating hole 2310 and fixing hole 242 to fix the fixing member 231 and 24 on the internal rail 22.

Figure 4:
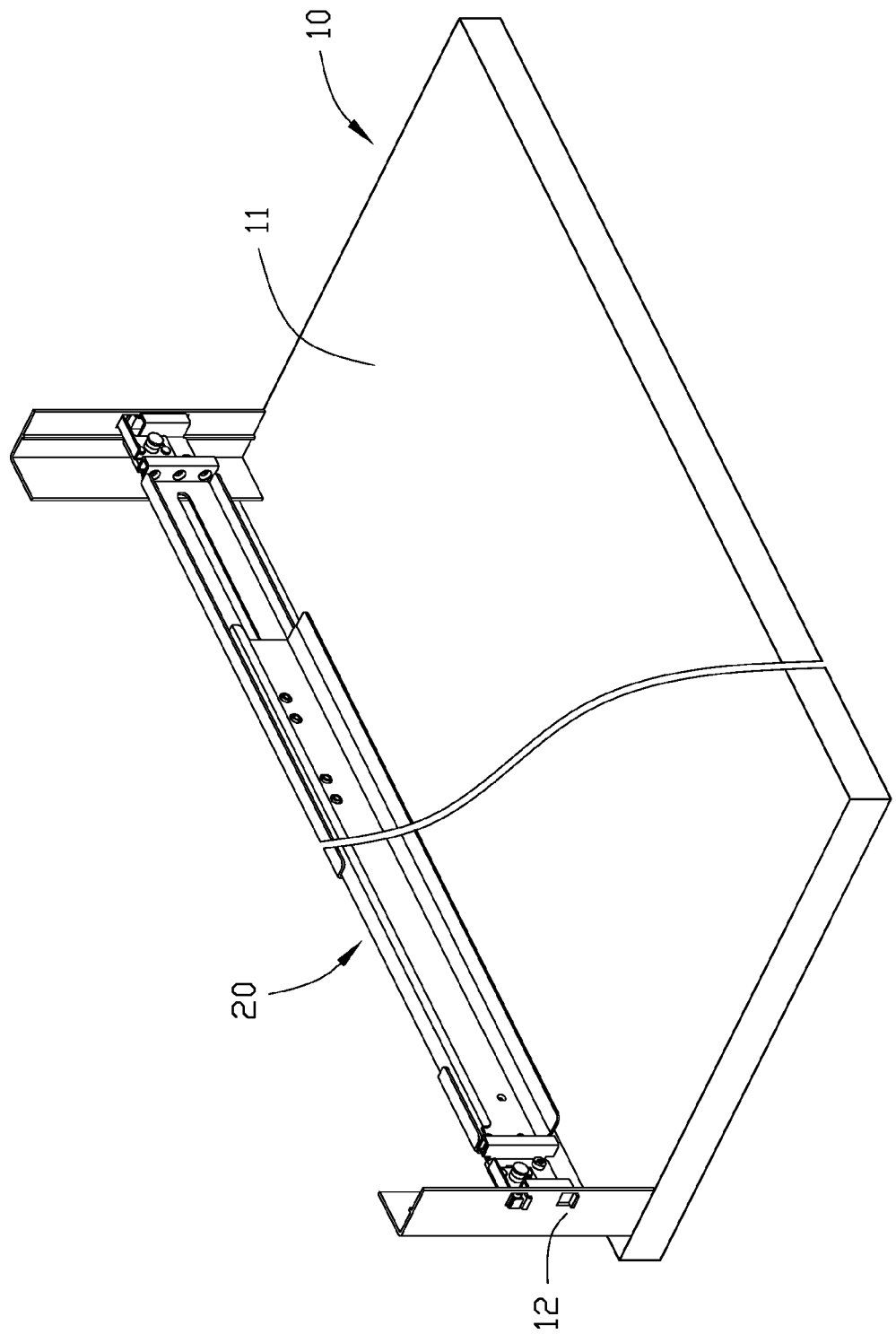
FIG. 4 is an assembled view of the server rack assembly and the base of FIG. 3.

Referring to FIGS. 3 and 4, the adjusting members 233 are received in the second accommodating hole 2312 of the fixing member 231 when the server rack assembly is not in use. In use, the hooks 2317 of the fixing members 231 are moved to engage with the upper positioning holes 121 in the stands 12 and abut against bottom edges of the upper positioning holes 121. The arms 2318 of the fixing members 231 abut against bottom edges of the lower positioning holes 121 on the stands 12. The adjusting members 233 are pulled out of the second accommodating holes 2312 and moved toward the first accommodating holes 2311 in the horizontal direction. The locking member 232 is moved relative to the fixing member 231, and the fasteners 234 slide in the corresponding sliding slots 2322. When the through holes 2321 of the locking members 232 are in alignment with the first accommodating holes 2311 of the fixing member 231, the adjusting members 233 are pushed into the first accommodating holes 2311. The restriction portions 2325 of the locking members 232 are received in the upper positioning holes 121 in the stands 12, and are located above the hooks 2317 of the fixing members 231 to resist against the hooks 2317. The top walls 2324 of the locking members 232 abut against top edges of the upper positioning holes 121 to prevent the hooks 2317 from moving out of the upper positioning holes 121. The rack 20 is fixed on the base 10.

In disassembly, the adjusting members 233 are pulled out of the first accommodating holes 2311 and moved toward the second accommodating holes 2312 in the horizontal direction. When the through holes 2321 of the locking members 232 are in alignment with the second accommodating holes 2312 of the fixing member 231, the adjusting members 233 are pushed into the second accommodating holes 2312. The restriction portions 2325 of the locking members 232 are moved out of the upper positioning holes 121 and release the hooks 2317 of the fixing members 231. The rack 20 is moved upward, and the hooks 2317 are released from the upper positioning holes 121. The rack 20 is detached from the base 10.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A server rack assembly comprising:
a base with a pair of opposite stands thereon, at least one first positioning hole being defined in each of the stands;
a rack spanning between the stands and mounted thereon; and
a pair of mounting apparatuses respectively mounted on two ends of the rack, each mounting apparatus comprising:
a fixing member comprising a hook thereon for engaging with the corresponding first positioning hole of one of the stands;
a locking member comprising of a restriction portion slidably positioned on the fixing member and moveable between a first position and a second position; in the first position, the restriction portion is received in the corresponding first positioning hole; in the second position, the restriction portion is out of the corresponding first positioning hole; wherein each mounting apparatus further comprises an adjusting member mounted on the locking member, the adjusting member is adjustable to allow the locking member to slide relative to the fixing member; the fixing member comprises a connecting portion, the connecting portion defines a first accommodating hole and a second accommodating hole thereon; a size and a shape of the first and the second accommodating holes correspond to a size and a shape of the adjusting member, the adjusting member extends through the locking member and slidably received in the first and the second accommodating holes.

2. The server rack assembly of claim 1, wherein in the first position, the restriction portion is above the hook in the first positioning hole, the restriction portion restricts movement of the hook within the corresponding first positioning hole in the up-and-down direction.

3. The server rack assembly of claim 1, wherein a bent portion extends perpendicularly from one side of the connecting portion, the hook is L-shaped and bent from a top edge of the bent portion.

4. The server rack assembly of claim 3, wherein each of the pair of stands further defines a second positioning hole below the at least one first positioning hole; the fixing member further comprises an arm bent horizontally from a bottom edge of the bent portion; and the arm is capable of receiving in the second positioning hole.

5. The server rack assembly of claim 1, wherein the locking member comprises a junction portion, a top wall bent horizontally from a top edge of the junction portion; the restriction portion extends downwards from an edge on one side of the top wall.

6. The server rack assembly of claim 5, wherein the connecting portion defines two mounting holes thereon, the junction portion defines two sliding slots, each of the two sliding slots corresponding to each of the two mounting holes, and fasteners extend through each of the two sliding slots and each of the two mounting holes so that the locking member is slidably positioned on the fixing member.

7. The server rack assembly of claim 6, wherein the junction portion further defines a through hole, the adjusting member extends through the through hole for securing the locking member relative to the fixing member; in the first position, the through hole is in alignment with the first accommodating hole, and the adjusting member is received in the first accommodating hole to fix the rack from the base.

8. The server rack assembly of claim 6, wherein in the second position, the through hole is in alignment with the second accommodating hole, and the adjusting member is received in the second accommodating hole to detach the rack on the base.

9. A server rack assembly comprising:
a base with a pair of opposite stands thereon, at least one first positioning hole being defined in each of the stands;
a rack spanning between the stands and mounted thereon; and
a pair of mounting apparatuses respectively mounted on two ends of the rack, each mounting apparatus comprising:
a fixing member comprising a hook thereon for engaging with the corresponding first positioning hole of one of the stands to prevent the hook from moving in the front-and-back direction and left-and-right direction in the first positioning hole;
a locking member comprising of a restriction portion slidably positioned on the fixing member, wherein the restriction portion is capable of receiving in the corresponding first positioning hole and above the hook, and preventing the hook from moving in the corresponding first positioning hole in the up-and-down direction to fix the rack on the base; wherein each mounting apparatus further comprises an adjusting member mounted on the locking member, the adjusting member is adjustable to slide the locking member relative to the fixing member; the fixing member comprises a connecting portion, the connecting portion defines a first accommodating hole and a second accommodating hole thereon corresponding to the adjusting member, and the adjusting member extends through the locking member and slidably received in the first and second accommodating holes.

10. The server rack assembly of claim 9, wherein a bent portion extends perpendicularly from one side of the connecting portion, the hook is L-shaped and bent from a top edge of the bent portion.

11. The server rack assembly of claim 10, wherein each of the pair of stands further defines a second positioning hole below the at least one first positioning hole; the fixing member further comprises an arm bent horizontally from a bottom edge of the bent portion; and the arm is capable of receiving in the second positioning hole.

12. The server rack assembly of claim 9, wherein the locking member comprises a junction portion, a top wall bent horizontally from a top edge of the junction portion; the restriction portion extends downwards from an edge on one side of the top wall.

13. The server rack assembly of claim 12, wherein the connecting portion defines two mounting holes thereon, the junction portion defines two sliding slots, each of the two sliding slots corresponding to each of the two mounting holes, and fasteners extend through each of the two sliding slots and each of the two mounting holes so that the locking member is slidably positioned on the fixing member.

14. The server rack assembly of claim 13, wherein the junction portion further defines a through hole, the adjusting member extends through the through hole for securing the locking member relative to the fixing member; in the first position, the through hole is in alignment with the first accommodating hole, and the adjusting member is received in the first accommodating hole to fix the rack on the base.

* * * * *